United States Patent
Schrödinger et al.

(10) Patent No.: US 6,667,660 B2
(45) Date of Patent: Dec. 23, 2003

(54) TEMPERATURE SENSOR AND CIRCUIT CONFIGURATION FOR CONTROLLING THE GAIN OF AN AMPLIFIER CIRCUIT

(75) Inventors: Karl Schrödinger, Berlin (DE); Jaro Stimma, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/918,190

(22) Filed: Jul. 30, 2001

(65) Prior Publication Data
US 2002/0014918 A1 Feb. 7, 2002

(30) Foreign Application Priority Data
Jul. 28, 2000 (DE) .......................... 100 38 693

(51) Int. Cl.$^7$ ................................. H03F 3/04
(52) U.S. Cl. ...................... 330/289; 330/256
(58) Field of Search ................. 330/289, 256, 330/254, 261, 278, 279, 285, 310; 327/512, 513

(56) References Cited

U.S. PATENT DOCUMENTS

| | | | | |
|---|---|---|---|---|
| 3,566,296 A | * | 2/1971 | Liu | 330/256 |
| 3,809,929 A | | 5/1974 | Vittoz | 327/512 |
| 4,413,235 A | * | 11/1983 | Jason | 327/350 |
| 4,604,586 A | | 8/1986 | Rinderle | 330/256 |
| 4,636,742 A | | 1/1987 | Oritani | 330/256 |
| 4,937,646 A | | 6/1990 | Tihanyi et al. | 257/370 |
| 5,319,268 A | | 6/1994 | Lyon et al. | 327/355 |
| 5,336,943 A | | 8/1994 | Kelly et al. | 327/512 |
| 5,355,123 A | | 10/1994 | Nishiura et al. | 340/653 |
| 5,357,149 A | | 10/1994 | Kimura | 327/512 |
| 5,629,542 A | | 5/1997 | Sakamoto et al. | 257/328 |
| 5,796,290 A | | 8/1998 | Takahashi | 327/512 |
| 5,801,584 A | * | 9/1998 | Mori | 327/513 |
| 5,818,294 A | | 10/1998 | Ashmore, Jr. | 327/543 |
| 6,084,474 A | * | 7/2000 | Lee | 330/254 |
| 6,278,325 B1 | * | 8/2001 | Juang | 330/285 |

FOREIGN PATENT DOCUMENTS

| | | |
|---|---|---|
| DE | 198 41 202 C1 | 3/2000 |
| EP | 0 523 799 A1 | 1/1993 |
| JP | 04 212 470 A | 8/1992 |
| JP | 05 129 598 A | 5/1993 |

* cited by examiner

Primary Examiner—Tuan T. Lam
(74) Attorney, Agent, or Firm—Laurence A. Greenberg; Werner H. Stemer; Gregory L. Mayback

(57) ABSTRACT

A temperature sensor has a first FET transistor circuit, whose operating point is located at the temperature-independent point, and a second FET transistor circuit whose operating point is above this point. The voltage difference in this case depends essentially linearly on the temperature. In addition, a circuit for controlling the gain of an amplifier circuit is provided, in which the current through the amplifier circuit at low temperatures is reduced by an appropriate control of the gate voltage of a transistor serving as a current source, so that an amplification which is substantially independent of temperature is carried out.

4 Claims, 3 Drawing Sheets

TEMPERATURE SENSOR AND CIRCUIT CONFIGURATION FOR CONTROLLING THE GAIN OF AN AMPLIFIER CIRCUIT

BACKGROUND OF THE INVENTION

FIELD OF THE INVENTION

The invention relates to a temperature sensor and to a circuit configuration for controlling the gain of an amplifier circuit.

Amplifier stages produced with field effect transistors (FETs) for high-frequency digital signals have a gain that has a considerable temperature dependence. The reason for this is a change in the transistor transconductance over temperature which, multiplied by the load resistance, defines the gain of a stage (gain V=load resistance RL*transconductance of the transistor $g_m$). In order to counteract a decrease in the transconductance of the transistor and therefore the gain over temperature, it is known to incorporate a derivative term or lead into the amplifier stage. However, at low temperatures, the derivative term disadvantageously results in a considerable increase in the gain which, because of an increasing tendency to oscillation, is undesirable.

Accordingly, there is a requirement to develop a circuit for an amplifier stage which reduces the temperature dependence of the gain, at best even eliminates it, without any increase in gain taking place in the range of low temperatures.

U.S. Pat. No. 4,636,742 discloses a circuit for an amplifier stage through the use of which the amplifier stage is fed with a constant current irrespective of the temperature. For this purpose, a current source with a positive temperature coefficient and a current source with a negative temperature coefficient are added. The combined current from these two current sources is then independent of temperature. However, in this known circuit, because of the use of a constant current source, the output voltage from the amplifier is kept constant, but not the gain. Instead, the latter decreases with increasing temperature.

U.S. Pat. No. 5,336,943 describes a temperature sensor which has two field effect transistors of which one is operated in the range below the cut-off voltage (subthreshold region) and the other is operated at an operating point at which, for a constant drain-source current, the gate voltage is substantially independent of temperature. By comparing the voltages at the two field effect transistors, a signal is generated which depends on the temperature of the transistor operated below the cut-off voltage.

A drawback with this known temperature sensor is that the output signal is small, because of the small currents and voltages in the range below the cut-off voltage, and can therefore be further processed only with difficulty.

SUMMARY OF THE INVENTION

It is accordingly an object of the invention to provide a circuit configuration for controlling the gain of an amplifier circuit which overcomes the above-mentioned disadvantages of the heretofore-known circuit configurations of this general type and which has a substantially temperature-independent gain of the amplifier circuit. It is a further object of the invention to provide a temperature sensor which provides a relatively large output signal that is substantially linearly dependent on the temperature. The temperature sensor should in particular be suitable for setting the temperature-dependent gain of an amplifier circuit.

With the foregoing and other objects in view there is provided, in accordance with the invention, a temperature sensor, including:

a first FET transistor circuit;

a second FET transistor circuit;

an operating device, connected the first FET transistor circuit and to the second FET transistor circuit, the operating device being configured to operate the second FET transistor circuit at a given operating point such that, at the given operating point, the second FET transistor circuit has a substantially temperature-independent gate voltage for a constant drain-source current, and the operating device being configured to operate the first FET transistor circuit in a given operating range above a temperature-independent operating point, such that, in the given operating range, the first FET transistor circuit has a gate voltage that increases with increasing temperature for a constant drain-source current; and an control device connected to the first FET transistor circuit and to the second FET transistor circuit, the control device being configured to evaluate a difference between a voltage at the first FET transistor circuit and a voltage at the second FET transistor circuit as a measure of a temperature at the first FET transistor circuit.

The temperature sensor according to the invention is distinguished by the fact that a first FET transistor circuit is operated in an operating range which is above the temperature-dependent operating point and in a range in which, for a constant drain-source current, the gate voltage increases with increasing temperature. A second FET transistor circuit is by contrast operated at an operating point at which, for a constant drain-source current, the gate voltage is substantially temperature-independent. This has the result that the difference between the voltages at the first and the second FET transistor circuits represents a measure of the temperature at the first FET transistor circuit and is evaluated accordingly.

It is pointed out that each field effect transistor has an operating point at which, for a constant drain-source current, the gate voltage is substantially independent of temperature (zero temperature coefficient point). Below this operating point, the drain-source current has a positive temperature coefficient, above this operating point a negative temperature coefficient. This is described extensively in the literature on field effect transistors.

The temperature sensor according to the invention has the advantage that, by operating the two FET transistor circuits firstly at the zero temperature coefficient point and secondly above this point, there is a substantially linear dependence of the output signal on the temperature. In this case, the output signal is the difference between the voltages on the two FET transistor circuits. In addition, an output voltage which is greater than that of a device described in U.S. Pat. No. 5,336,943 is generated, so that the output signal may easily be processed further.

The device for operating the first FET transistor circuit and the device for operating the second FET transistor circuit preferably have a current generator which feeds the two transistor circuits with constant current. The current generator advantageously includes two coupled current sources which feed the FET transistor circuits. By using a current generator which operates the two FET transistor circuits with different currents, the desired operating points of the transistor circuits can be set simply and reliably.

Alternatively, the device for operating the first and second FET transistor circuits each have a resistor which is connected in series with the respective FET transistor circuit. In this embodiment, the FET transistor circuits are fed through the resistors.

In a further embodiment of the temperature sensor according to the invention, an amplifier circuit is additionally provided which detects the difference between the voltages on the first and second FET transistor circuits and converts the differential voltage into a control voltage for an amplifier circuit connected downstream. Because of the given temperature dependence, the differential voltage increases substantially linearly with temperature. The amplifier circuit amplifies the differential voltage and adapts it at the operating point.

The FET transistor circuits preferably each have at least one FET transistor, in particular a MOS transistor, which is operated in a diode circuit, that is to say the gate is connected to the drain terminal.

In order to permit a variable generation of the differential voltage between the two FET transistor circuits, a further configuration of the invention provides for the use of cascaded MOS transistors for the first and/or the second FET transistor circuit. In this case, by varying the feed currents and the transistor variables, the differential voltage can be set over a very wide voltage range in a simple manner.

With the objects of the invention in view there is also provided, in combination with an amplifier circuit, a circuit configuration for controlling a gain of the amplifier circuit, including:
  a FET control transistor having a gate and operating as a current source for the amplifier circuit; and
  a control circuit, connected to the FET control transistor for controlling a gate voltage of the FET control transistor such that a current through the amplifier circuit is reduced with reduced temperatures of the amplifier circuit so that the gain of the amplifier circuit is substantially temperature-independent.

This circuit configuration is distinguished by a device for controlling the gate voltage (control voltage) of a FET control transistor which is used as a current source for the amplifier circuit. According to the invention, the FET control transistor is controlled in such a way that the current through the amplifier stage is reduced at lower temperatures of the amplifier stage, so that an amplification which is substantially independent of temperature is carried out.

The solution according to the invention is based on the idea of reducing the gain of the amplifier circuit at low temperatures. For this purpose, the current Iv through the control transistor is reduced increasingly for low temperatures such that the gain remains substantially constant. A smaller current leads to a reduced gain, since the transconductance of a transistor is proportional to the square root of the drain current. A reduced drain current therefore results in a lower transconductance, so that the gain decreases.

The solution according to the invention is based on a completely novel concept since the temperature dependence of the gain is not compensated for by additional gain in the range of high temperatures, as hitherto in the prior art, but that instead, starting from a sufficient gain V0 at the maximum operating temperature, the current through the control transistor and the amplifier circuit is reduced with decreasing temperature, so that the overall result is a substantially constant gain.

In a preferred embodiment of the circuit configuration according to the invention, the device for controlling the control voltage of the control transistor include the temperature sensor according to the invention. This registers the temperature of the amplifier circuit and, at the same time, generates a differential voltage which depends virtually linearly on the temperature present. The differential voltage is converted via an amplifier into a control voltage for controlling the control transistor and therefore the current through the amplifier circuit. The current source for the amplifier circuit is therefore controlled via the control voltage.

The amplifier circuit preferably has at least one differential amplifier, in particular a plurality of differential amplifiers connected in a cascade circuit. The gain of the amplifier circuit is in this case preferably based on a transistor transconductance.

Other features which are considered as characteristic for the invention are set forth in the appended claims.

Although the invention is illustrated and described herein as embodied in a temperature sensor and a circuit configuration for controlling the gain of an amplifier circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3b is a circuit diagram of a MOS transistor during the recording of the transistor characteristic curve according to FIG. 3a.

DESCRIPTION OF THE PREFERRED EMBODIMENTS

Figure 1:
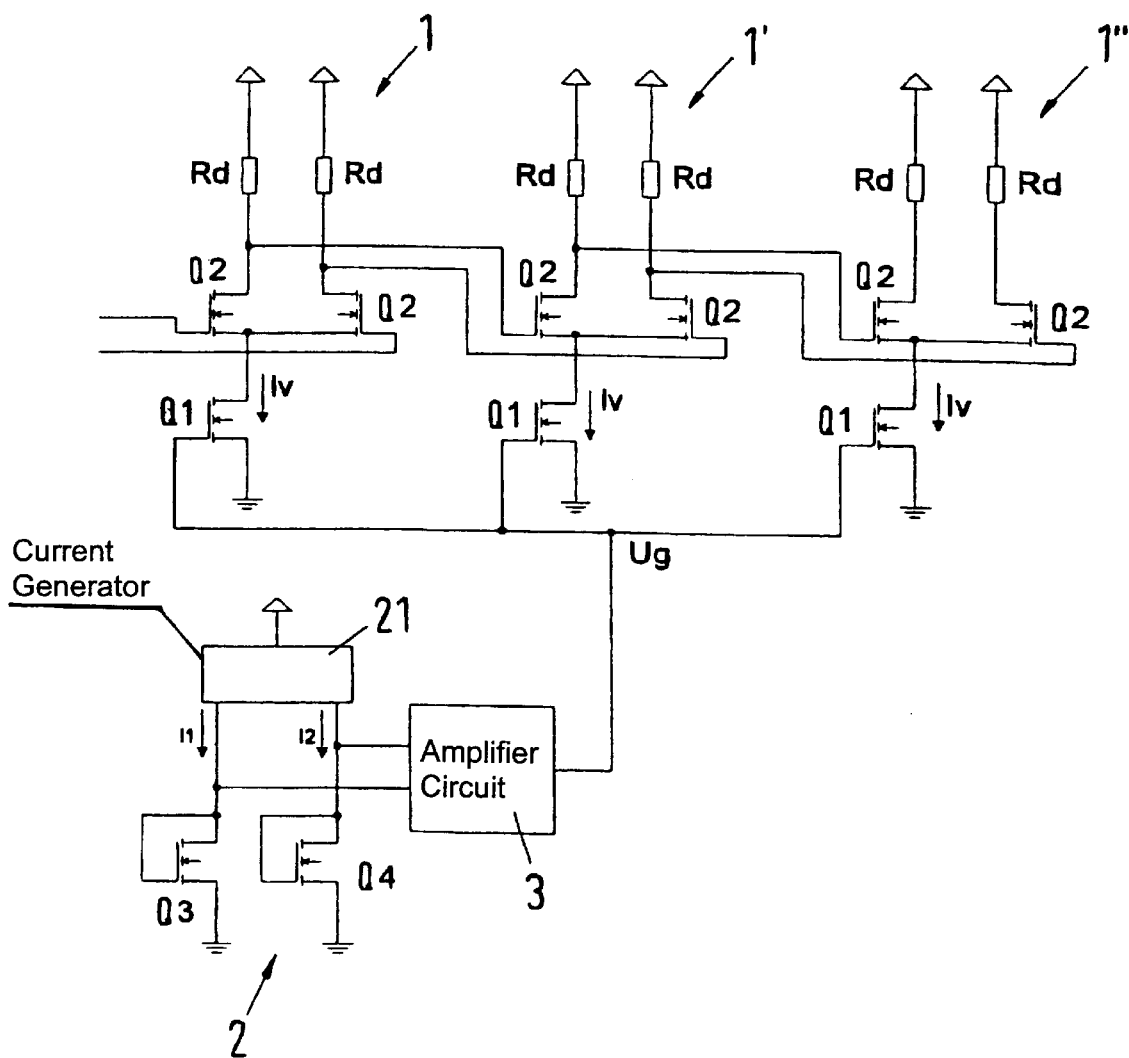
FIG. 1 is a circuit diagram of an amplifier circuit with an exemplary embodiment of a circuit configuration according to the invention and an exemplary embodiment of a temperature sensor according to the invention.

Referring now to the figures of the drawings in detail and first, particularly, to FIG. 1 thereof, there is shown an amplifier circuit having three amplifier stages 1, 1', 1", each of which includes MOS transistors Q1, Q2 and drain resistors Rd. The amplifier stages 1, 1', 1" can be configured identically. However, this is not necessarily the case.

The source terminals of the two transistors Q2 of an amplifier stage are jointly connected to the drain terminal of the transistor Q1, which is used as a current source. The source terminal of the transistor Q1 is connected to ground. The drain terminals of the transistors Q2 are each connected via a drain resistor Rd to a voltage source. The voltages on the drain terminals of the transistors Q2 of a stage 1, 1' are fed to the differential amplifier of the next stage 1', 1" as an input. Amplifier stages of this type are known per se.

Through the use of the gate voltage on the transistor Q1, the current through the individual amplifier stages 1, 1', 1"

is set in each case. As explained below, the gate voltage is set in such a way that the current Iv through the amplifier stages is reduced with decreasing temperature. This leads to the situation where, starting from a sufficient gain V0 at a maximum operating temperature, the gain or the transistor transconductance $g_m$ remains constant with decreasing temperature.

Figure 2:
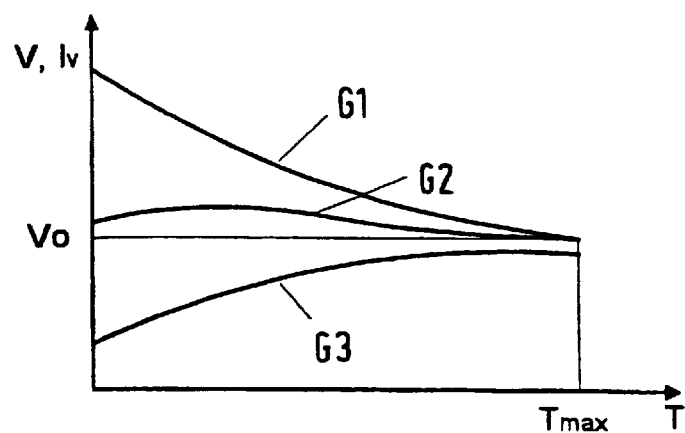
FIG. 2 is a graph for illustrating the gain and the control current as a function of the temperature, with and without gain control.

This relationship is shown schematically in FIG. 2. The upper graph G1 in FIG. 2 shows the gain V (which is proportional to the transistor transconductance $g_m$) at constant current, without the control of the gate voltage of the transistor Q1 explained below. The gain V decreases quadratically with increasing operating temperature T and, at a maximum operating temperature $T_{max}$, reaches the value V0.

The lower curve G3 shows the current Iv through the amplifier stage which, according to the invention, is reduced with decreasing temperature as a result of appropriate setting of the control voltage or gate voltage of the transistor Q1.

Since the transconductance of a transistor operated in the saturation range is proportional to the root of the drain current Id, the reduced current Iv reduces the gain of the amplifier stage correspondingly at low temperatures. This leads to the gain being substantially constant over the entire temperature range and corresponding to the value V0. This is illustrated in the central graph G2 of FIG. 2.

Control of the gate voltage Ug of the transistors Q1 is carried out through the use of a temperature sensor 2 and an amplifier circuit 3.

According to FIG. 1, the temperature sensor 2 is implemented through the use of two MOS transistors Q3 and Q4, which are provided as a diode circuit, that is to say the gate terminal and the drain terminal of the transistors are connected to each other. The transistors Q3 and Q4 are operated with different currents I1 and I2 via a current generator 21 having two coupled current sources. The current generator 21 is connected to the gate terminal; the source terminal of the two transistors is grounded in each case.

The amplifier circuit which essentially operates as a control circuit 3 has two inputs, of which one input is connected to the drain terminal of the transistor Q3 and the other input is connected to the drain terminal of transistor Q4. The control circuit 3 therefore registers the differential voltage on the two transistors Q3 and Q4 and converts this differential voltage into a control voltage Ug, which forms the gate voltage of the transistors Q1 serving as the current sources of the amplifier stages 1, 1', 1".

Figure 3A:
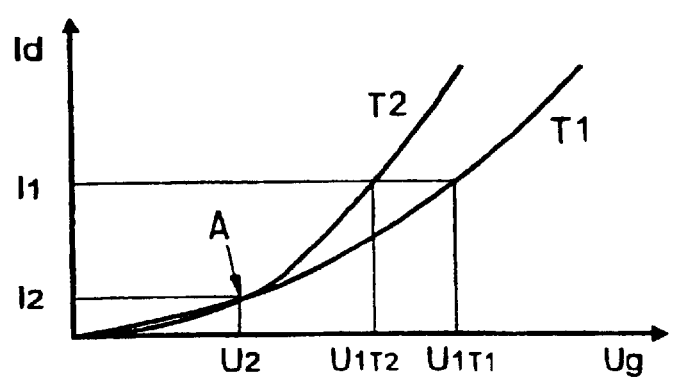
FIG. 3a is a graph for illustrating the transistor characteristic curve of a MOS transistor for two temperatures.
Figure 3B:
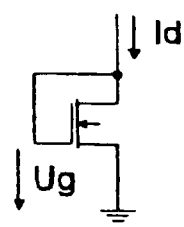

Depending on the current density, the result is a different temperature dependence of the gate voltage, which is utilized for temperature measurement. FIG. 3a shows in schematic form the transistor characteristic curve of a MOS transistor (for example the transistor Q3 or the transistor Q4 of FIG. 1) for two temperatures T1 and T2, T2 being lower than T1. The associated circuit, in which the transistor characteristic curve is recorded, is shown in FIG. 3b. The transistor is operated in a diode circuit when recording the transistor characteristic curve.

According to FIG. 3a, there exists an operating point A at which the temperature coefficient is equal to zero, that is to say for a constant drain-source current Id, the gate voltage Ug is independent of temperature. Below this point A, the temperature coefficient of the drain-source current Id is positive, and negative above the point A.

In the circuit according to FIG. 1, the transistor Q4 is now operated with a current intensity I2 which corresponds to the temperature-independent operating point A. Accordingly, the voltage U2 on the transistor Q4 is constant.

By contrast, the transistor Q3 is operated at an operating point above the temperature-independent operating point A. In this range, the temperature coefficient of Id is negative, that is to say as the temperature increases, a higher voltage is needed in order to realize a predefined current intensity I2. For example, in FIG. 3a, in order to realize the current intensity I2 at the (lower) temperature T2, the voltage U1T2 is needed and, at the (higher) temperature T1, the higher voltage U1T1 is needed.

Since the transistor Q4 is operated at the operating point I1 and the transistor Q3 is operated at the operating point I2, the voltage at the operating point I1 varies as a function of the temperature, while that at the operating point I2 remains constant. The differential voltage (U2−U1) is proportional to the temperature T present, that is to say as the temperature of the transistor T3 increases, the differential voltage (U2−U1) also increases.

The differential voltage (U2−U1) is converted by the amplifier circuit 3 into the control voltage Ug, adaptation of the operating point also being carried out in addition to amplification. Through the use of the control voltage Ug, the gate voltage of the transistors Q1 is set in accordance with the desired current Iv. Here, the temperature dependence of the gain or the transconductance of the transistors Q2 is compensated for by the current Iv through the amplifier stages 1, 1', 1" being reduced with decreasing temperature. At the same time, the transistors Q3, Q4 and the transistors Q1 and Q2 are of course thermally coupled, so that the temperature of the transistors Q2 can be determined via the transistor Q4. For the purpose of thermal coupling, the appropriate transistors are, for example, configured to be integrated in one silicon chip.

In the event of a decrease in the temperature, the voltage U1 on the transistor Q3 of the temperature sensor 2 decreases. Accordingly, the differential voltage (U2−U1) also decreases. The control voltage Ug, which represents the gate voltage of the transistors Q1, is therefore also reduced. As the temperatures decrease, this leads to a reduced current Iv through the amplifier stages. The circuit illustrated therefore ensures that, at low temperatures, only a reduced current flows through the amplifier stages, which in turn leads to a reduced gain, which compensates for the increase in the gain at low temperatures.

Figure 4:
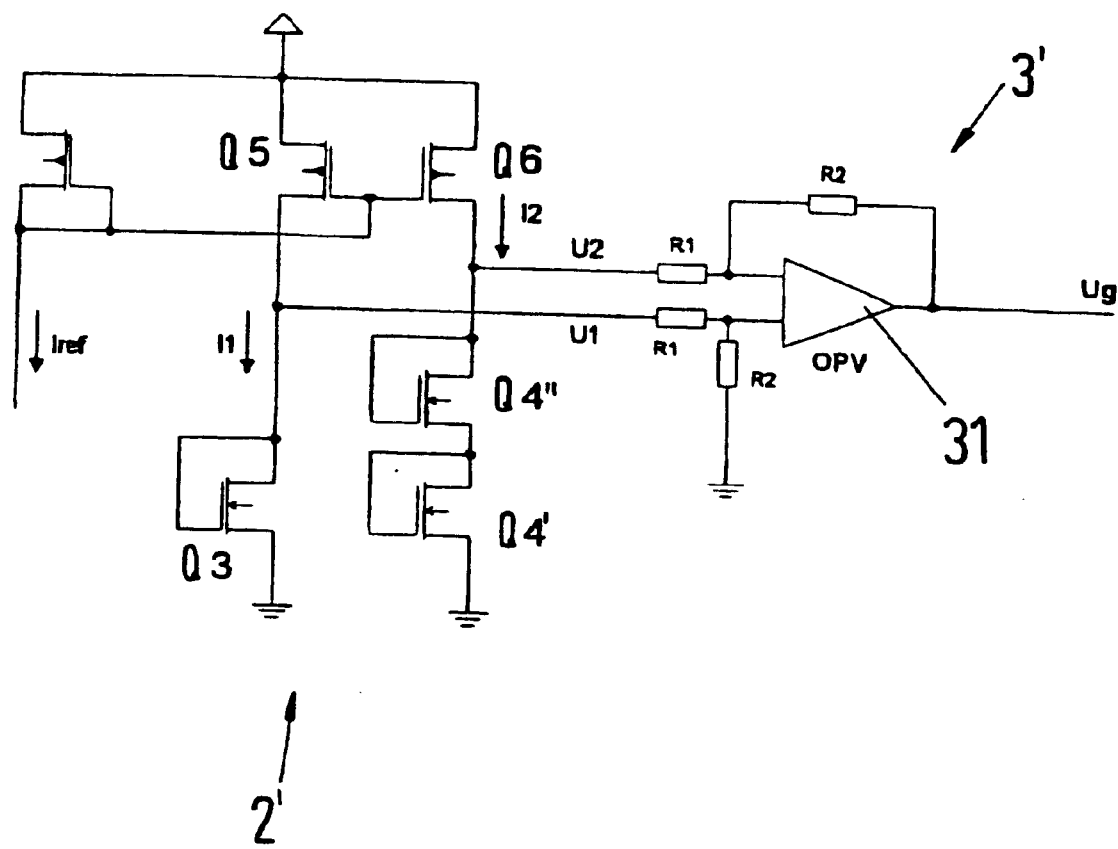
FIG. 4 is a circuit diagram of an exemplary embodiment of a temperature sensor according to the invention.

FIG. 4 shows in more detailed form an exemplary embodiment of a temperature sensor 2' and an amplifier circuit 3'. In contrast to FIG. 1, the transistor Q4 has been replaced by two transistors Q4', Q4", which are provided in cascade. Two transistors Q5 and Q6 are used as current sources for the currents I1 and I2.

The amplifier circuit 3' is formed by a subtraction circuit, known per se, for the two input voltages U2 and U1. The subtraction circuit has an inverting operational amplifier 31, to which the input voltage U1 is fed via a voltage divider at the non-inverting input. Since the ratio of the resistors R1, R2 at the inverting and at the non-inverting inputs is the same, only the difference between the input voltages (U2−U1) is amplified and output as the control voltage Ug.

By varying the currents I1 and I2 and the transistor variables Q3, Q4', Q4", the differential voltage (U2−U1) in the circuit according to FIG. 4 can be set in a virtually arbitrary manner. It is therefore possible for this voltage to be set to the requisite voltage Ug through the use of the operational amplifier 31.

We claim:

1. In combination with an amplifier circuit, a circuit configuration for controlling a gain of the amplifier circuit, comprising:

a FET control transistor having a gate and operating as a current source for the amplifier circuit; and a control circuit, connected to said FET control transistor for controlling a gate voltage of said FET control transistor such that a current through the amplifier circuit is reduced with reduced temperatures of said amplifier circuit so that the gain of the amplifier circuit is substantially temperature-independent, said control circuit including a temperature sensor for registering a temperature of the amplifier circuit and, as a function of the temperature of the amplifier circuit, generating a difference voltage, and said control circuit converting the difference voltage into a control voltage for said gate of said FET control transistor.

2. The circuit configuration according to claim 1, wherein the amplifier circuit has at least one differential amplifier.

3. The circuit configuration according to claim 1, wherein the amplifier circuit has a plurality of differential amplifiers provided as a cascade circuit.

4. The circuit configuration according to claim 3, wherein the gain of the amplifier circuit is based on a transistor transconductance.

* * * * *